(12) United States Patent
Kuwahara et al.

(10) Patent No.: US 8,743,564 B2
(45) Date of Patent: Jun. 3, 2014

(54) OPTICAL DEVICE

(75) Inventors: Ryo Kuwahara, Kanagawa (JP); Ken Ashizawa, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 219 days.

(21) Appl. No.: 13/450,858

(22) Filed: Apr. 19, 2012

(65) Prior Publication Data

US 2012/0267738 A1  Oct. 25, 2012

(30) Foreign Application Priority Data

Apr. 22, 2011 (JP) ................................ 2011-096356

(51) Int. Cl.
*H01L 31/0203* (2006.01)

(52) U.S. Cl.
USPC .......... 361/807; 257/432; 257/684; 257/690; 361/806

(58) Field of Classification Search
USPC ......... 361/807, 806, 808, 811, 813, 435, 730, 361/737; 257/684, 685, 693, 713, 433, 434; 372/36; 362/217
See application file for complete search history.

(56) References Cited

U.S. PATENT DOCUMENTS

| 7,263,112 B2* | 8/2007 | Oomori et al. | 372/36 |
| 2005/0047461 A1* | 3/2005 | Kihara et al. | 372/43 |
| 2005/0100064 A1* | 5/2005 | Stewart et al. | 372/36 |
| 2005/0110105 A1* | 5/2005 | Kuhara et al. | 257/432 |
| 2005/0207459 A1* | 9/2005 | Yu et al. | 372/36 |
| 2007/0177883 A1 | 8/2007 | Kagaya et al. | |
| 2008/0267233 A1* | 10/2008 | Deng et al. | 372/34 |

FOREIGN PATENT DOCUMENTS

| JP | 60-052063 A | | 3/1985 | |
| JP | 05082906 A | * | 4/1993 | ...................... 372/75 |
| JP | 2003-318418 A | | 11/2003 | |
| JP | 2007-201213 A | | 8/2007 | |
| JP | 2010-135688 A | | 6/2010 | |

OTHER PUBLICATIONS

English Translation of the Takanashi, Kenichi JP 05-082906 A, dated Apr. 2, 1993, translated on Jan. 8, 2014.*

* cited by examiner

*Primary Examiner* — Robert J Hoffberg
*Assistant Examiner* — Michael Matey
(74) *Attorney, Agent, or Firm* — Westerman, Hattori, Daniels & Adrian, LLP

(57) ABSTRACT

An optical device includes: a stem; a mount portion connected with the stem and having an upper face, a first face and a second face opposite to the first face, the first face and the second face constituting a side face with respect to the upper face; an optical element mounted on the upper face of the mount portion; an electronic components mounted on the first face and the second face of the mount portion respectively; a first lead that penetrates the stem and is extended to a side of the first face of the mount portion; and a second lead that penetrates the stem and is extended to a side of the second face of the mount portion.

18 Claims, 11 Drawing Sheets

OPTICAL DEVICE

CROSS-REFERENCE TO RELATED APPLICATION

This application is based upon and claims the benefit of priority of the prior Japanese Patent Application No. 2011-096356, filed on Apr. 22, 2011, the entire contents of which are incorporated herein by reference.

BACKGROUND (i) Technical Field

The present invention relates to an optical device.

(ii) Related Art

A CAN package type optical device that is appropriate for downsizing and low cost is known as an optical device on which an optical element such as a PD element or a LD element is mounted. For example, FIG. 1 of Japanese Patent Application Publication No. S60-52063 discloses a CAN package type optical device in which an optical element is mounted on an upper face of a stem.

However, there is a problem that a space for mounting is insufficient in a structure in which an optical element and an electronic component are mounted on an upper face of a stem, when the number of the electronic component is increased. On the other hand, Japanese Patent Application Publication No. 2003-318418 (hereinafter referred to as Document 2) discloses a CAN package type optical device in which an optical element is mounted on an upper face of a stem, a mount portion projects from the upper face of the stem, and an electronic component is mounted on the mount portion. With the structure of Document 2, there is a space for mounting on a surface of the mount portion in addition to the upper face of the stem. Thus, the space for mounting the optical device is enlarged. Even if the number of the electronic component is increased, the problem of the space for mounting may be dissolved.

SUMMARY

However, with the structure of Document 2, when an electronic component is electrically connected to a lead, the connection may be complicated.

It is an object to provide an optical device securing a large space for mounting in which an electronic component is easily coupled to a lead.

According to an aspect of the present invention, there is provided an optical device including: a stem; a mount portion connected with the stem and having an upper face, a first face and a second face opposite to the first face, the first face and the second face constituting a side face with respect to the upper face; an optical element mounted on the upper face of the mount portion; electronic components mounted on the first face and the second face of the mount portion respectively; a first lead that penetrates the stem and is extended to a side of the first face of the mount portion; and a second lead that penetrates the stem and is extended to a side of the second face of the mount portion.

According to another aspect of the present invention, there is provided an optical device including: a stem composed of a metal; a mount portion composed of a metal and connected with the stem, the mount portion having an upper face, a first face and a second face opposite to the first face, the first face and the second face constituting a side face with respect to the upper face, the mount portion being electrically coupled with the stem; an optical element mounted on the upper face of the mount portion; electronic components mounted on the first face and the second face of the mount portion respectively; a first lead that penetrates the stem and is extended to a side of the first face of the mount portion; a second lead that penetrates the stem and is extended to a side of the second face of the mount portion; a third lead extended from the stem to outside and electrically coupled to the stem; a wiring piece composed of a dielectric material, the wiring piece having a wiring electrically coupled between the electronic components mounted on the first face and the second face; and a substrate composed of a dielectric material, the substrate being mounted on the first face of the mount portion and having a wiring formed on an upper face of the substrate adjacent to a side face of the first lead.

DETAILED DESCRIPTION

Figure 1A:
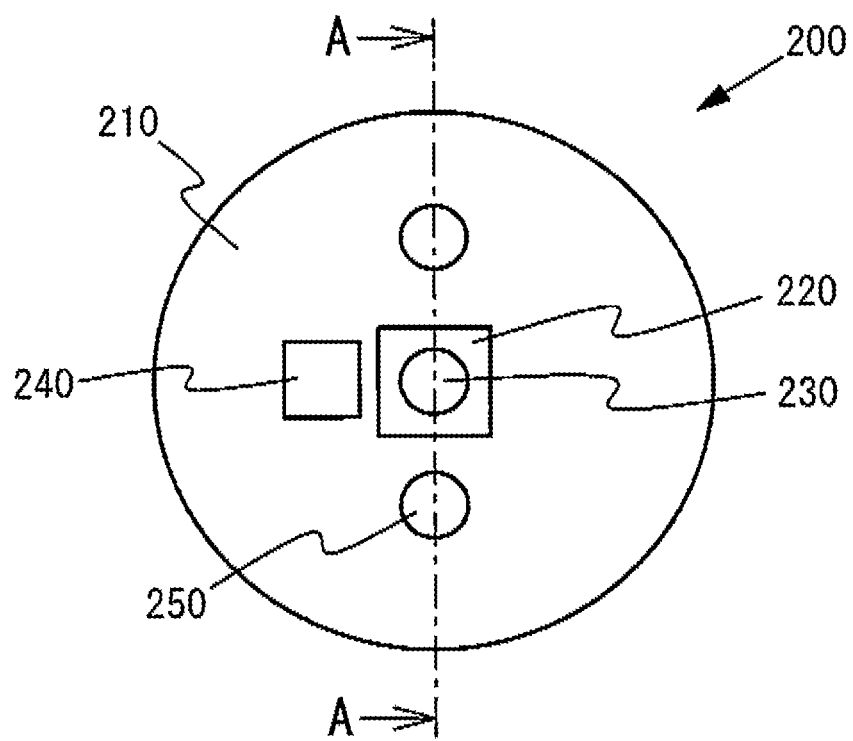
FIG. 1A illustrates a top view of an optical device in accordance with a first comparative example.
Figure 1B:
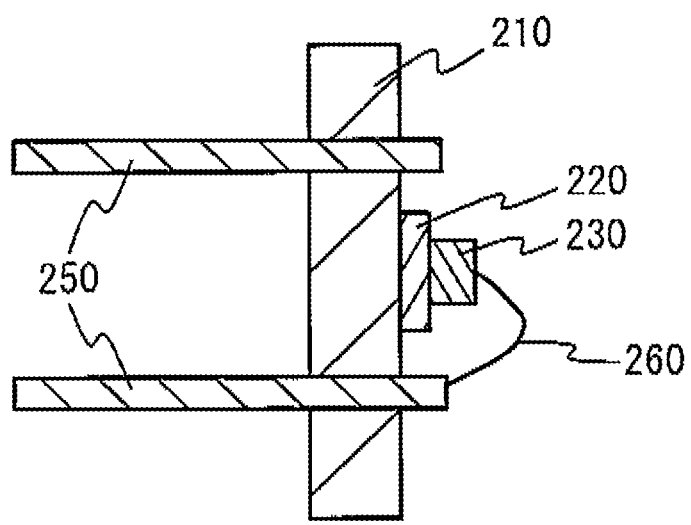
FIG. 1B illustrates a cross sectional view taken along a line A-A of FIG. 1A.

A description will be given of an optical device in accordance with a first comparative example and another optical device in accordance with a second comparative example. The optical devices in accordance with the first comparative example and the second comparative example are an example of a CAN package type light receiver. FIG. 1A illustrates an example of an upper face of the optical device in accordance with the first comparative example. FIG. 1B illustrates a cross sectional view taken along a line A-A of FIG. 1A. As illustrated in FIG. 1A and FIG. 1B, an optical device 200 in accordance with the first comparative example has a structure in which a PD (Photo Diode) 230 is mounted on an upper face of a stem 210 through a PD-mount portion 220. An electronic component 240 such as a capacitor electrically coupled to the PD 230 is also mounted on the upper face of the stem 210. The PD 230 and the electronic component 240 are electrically coupled to each other via a lead 250 penetrating the stem 210 and a bonding wire 260. In FIG. 1A and FIG. 1B, a cap, a receptacle and so on provided on the stem 210 are omitted.

In the optical device 200 in accordance with the first comparative example, the PD 230 and the electronic component 240 are mounted on the upper face of the stem 210. A diameter of the stem 210 is determined in advance. Therefore, there is a case where a space for mounting may be insufficient in an optical device operating in a broad frequency band. This is because the number of electronic components is increased, because a filter used in a broadband from low frequency to high frequency is structured with a plurality of electronic components.

Figure 2:
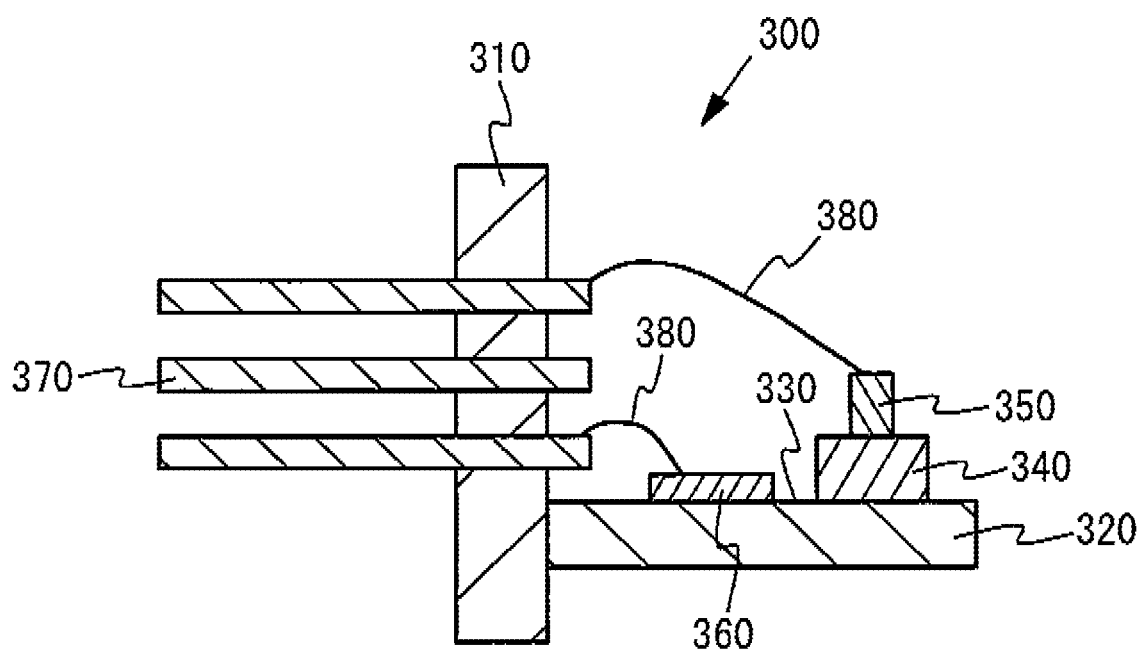
FIG. 2 illustrates a cross sectional view of an optical device in accordance with a second comparative example.

FIG. 2 illustrates an example of a cross section of an optical device in accordance with the second comparative example. As illustrated in FIG. 2, an optical device 300 in accordance with the second comparative example has a mount portion 320 projecting from an upper face of a stem 310. A PD 350 is mounted on a face 330 of the mount portion 320 through a PD-mount portion 340. An electronic component 360 such as a capacitor electrically coupled to the PD 350 is also mounted on the face 330 of the mount portion 320. The PD 350 and the electronic component 360 are electrically coupled to each other via a lead 370 penetrating the stem 310 and a bonding wire 380. In FIG. 2, a cap, a receptacle and so on provided on the stem 310 are omitted.

In the optical device 300 in accordance with the second comparative example, the PD 350 and the electronic component 360 are mounted on the face 330 of the mount portion 320 projecting from the upper face of the stem 310. When the mount portion 320 is long, an area of the face 330 is enlarged, and a space for mounting is enlarged. This restrains lack of space for mounting in the optical device 300 in accordance with the second comparative example, even if the number of mounted components is enlarged. However, the leads 370 are arranged on one side of the mount portion 320, because the PD 350 and the electronic component 360 are mounted on the face 330 of the mount portion 320. Therefore, in a case where a plurality of the leads 370 are provided, the connection through the bonding wires 380 between the PD 350, the electronic component 360 and the leads 370 may be complicated. The leads 370 are concentrically arranged on the face 330 side. Therefore, an arrangement freedom degree of the leads 370 is degraded. And so, a description will be given of embodiments that are capable of securing a large mount space and making a connection between an electronic component and a lead easy.

First Embodiment

Figure 3:
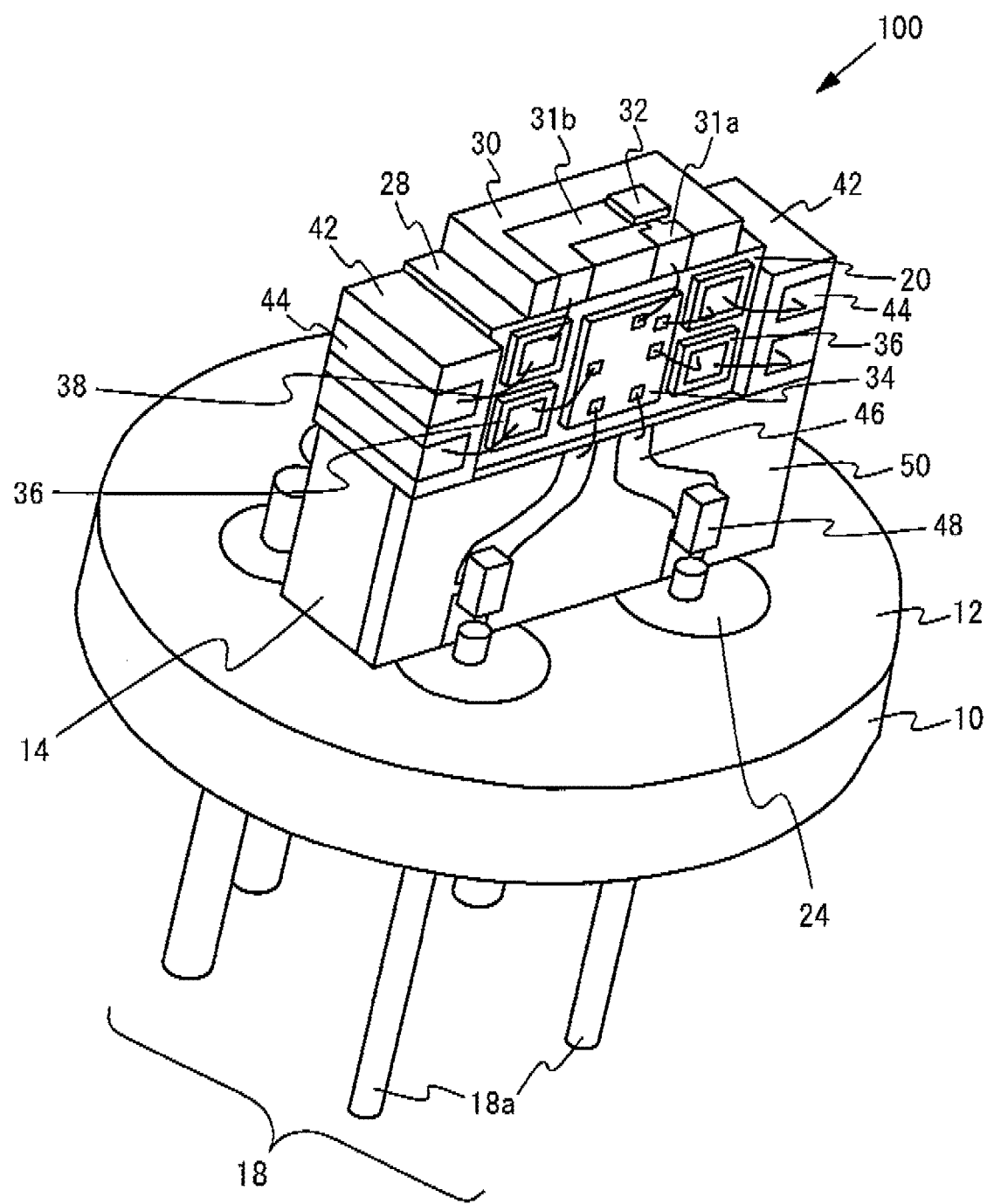
FIG. 3 illustrates a perspective view of an optical device in accordance with a first embodiment viewed from a first face side.
Figure 4:
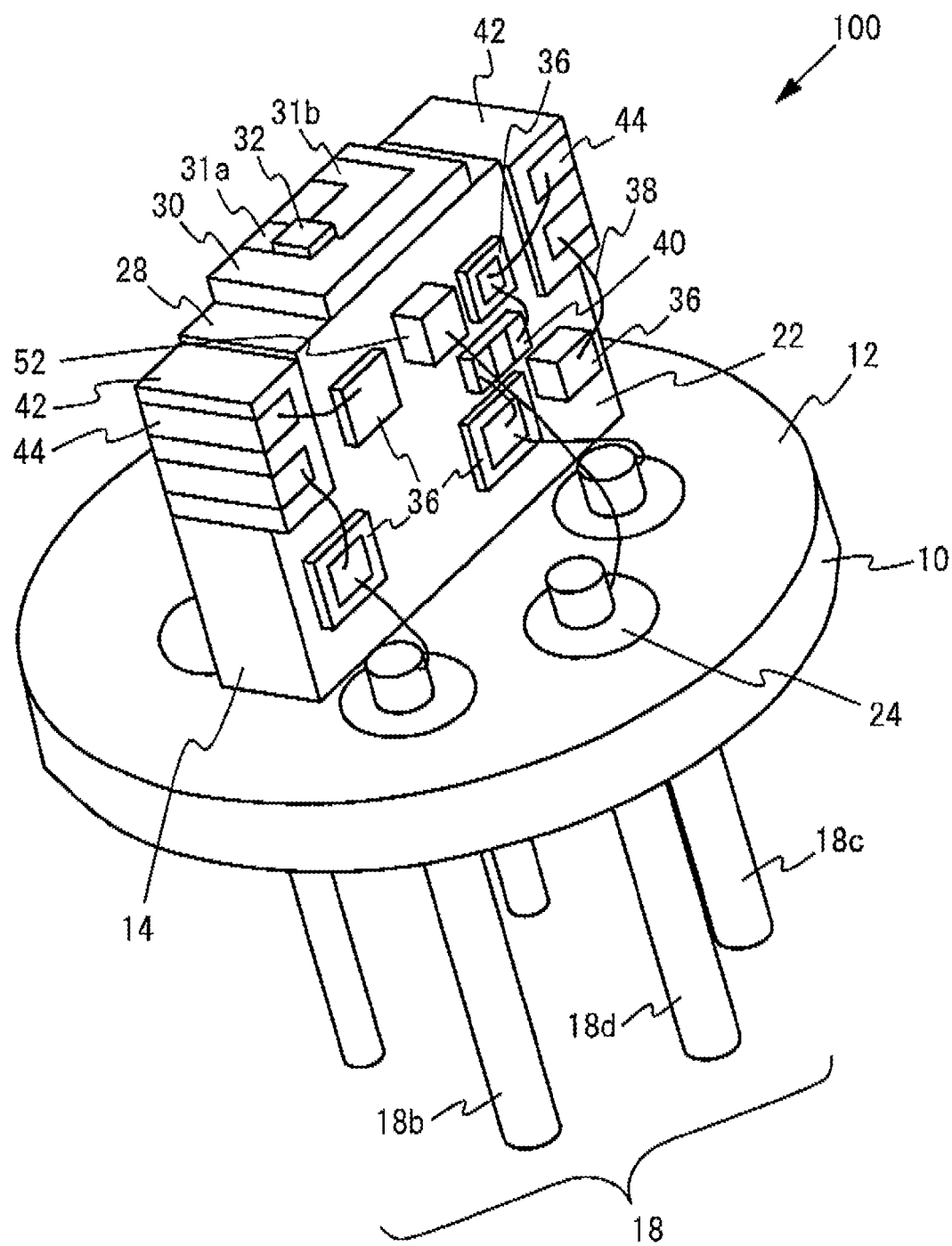
FIG. 4 illustrates a perspective view of the optical device in accordance with the first embodiment viewed from a second face side.

An optical device in accordance with a first embodiment is an example of a CAN package type light receiver. FIG. 3 illustrates a perspective view of the optical device in accordance with the first embodiment viewed from a first face side. FIG. 4 illustrates a perspective view of the optical device in accordance with the first embodiment viewed from a second face side. In FIG. 3 and FIG. 4, a cap, a receptacle and so on provided on a stem are omitted. As illustrated in FIG. 3 and FIG. 4, an optical device 100 in accordance with the first embodiment has a stem 10 and a mount portion 14. The stem 10 is composed of a metal such as kovar (iron-nickel-cobalt alloy) and has a circular cylinder shape. The mount portion 14 is composed of a metal such as kovar and projects from an upper face 12 of the stem 10 around a center of the stem 10. The mount portion 14 has an upper face 28, a lower face, a first face 20 and a second face 22. The first face 20 and the second face 22 are a side face with respect to the upper face 28 and the lower face. The lower face is coupled to the upper face 12 of the stem 10. The first face 20 and the second face 22 face with each other. The mount portion 14 has a convex shape and has a recess portion that is a removed portion of a rectangular parallelepiped shape.

A plurality of leads 18 penetrating the stem 10 are provided. The plurality of the leads 18 are provided on the first face 20 side and on the second face 22 side facing with the first face 20, and sandwich the mount portion 14. The plurality of the leads 18 are fixed to the stem 10 through an insulator 24 such as sealing glass.

Figure 5:
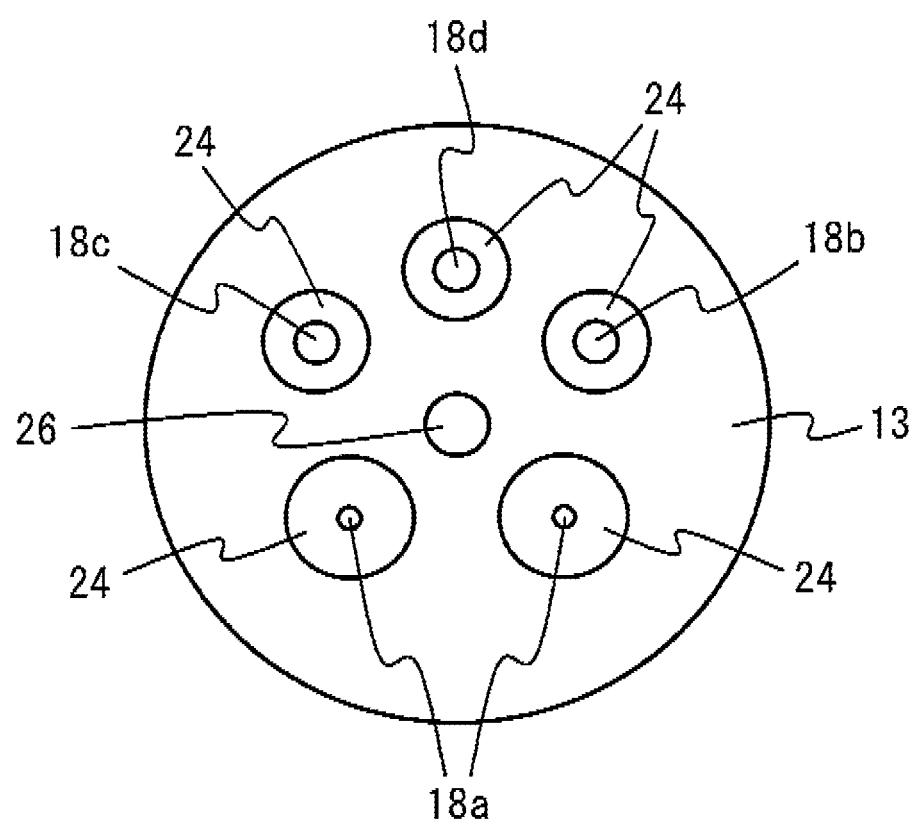
FIG. 5 illustrates a bottom view of the optical device in accordance with the first embodiment.

A description will be given of the lead 18 with reference to FIG. 3 through FIG. 5. FIG. 5 illustrates a lower face side of the optical device in accordance with the first embodiment. As illustrated in FIG. 3 through FIG. 5, Other plurality of the leads 18 penetrating the stem 10 are arranged in a circular pattern. The plurality of the leads 18 include an outputting lead 18a outputting a signal from a PD (Photo Diode) element described later to outside via a TIA (Trans Impedance Amplifier), a PD power-supply lead 18c supplying electrical power to the PD element, a TIA power-supply lead 18b supplying electrical power to a TIA (Trans Impedance Amplifier) described later, and a thermistor lead 18d outputting temperature value measured by a thermistor acting as a temperature detection element. The outputting lead 18a is provided on the first face 20 side of the mount portion 14. The PD power-supply lead 18c, the TIA power-supply lead 18b and the thermistor lead 18d are provided on the second face 22 side of the mount portion 14. A lead 26 is coupled to a center portion of a lower face 13 of the stem with a brazing filler metal. The lead 26 is to be coupled with a ground potential. Thus, the stem 10 and the mount portion 14 are grounded. In FIG. 3 and FIG. 4, the lead 26 is omitted. The leads 18a denote a first lead, the leads 18b, 18c and 18d denote a second lead and the lead 26 denote a third lead. The first, second and third leads extend in the same direction.

As illustrated in FIG. 3 and FIG. 4, a PD element 32 is mounted on an element-mount portion 30. The element-mount portion 30 is mounted on the upper face 28 of the mount portion 14. The upper face 28 is an edge face of the optical device 100 on the side of an incoming light. The element-mount portion 30 is composed of dielectric material such as ceramics. A wiring 31a and a wiring 31b electrically coupled to the PD element 32 are provided on a surface of the element-mount portion 30. The PD element 32 is a flip-chip type photo diode. An electrode formed on a lower face of the PD element 32 is coupled to the wiring 31a and the wiring 31b. A lens is provided on an upper face of the PD element 32. A light incoming into the optical device 100 enters the lens of the PD element 32.

A TIA (Trans Impedance Amplifier) 34 is mounted on the first face 20 of the mount portion 14 and is electrically coupled to the PD element 32 via the wiring 31a and a bonding wire 38. A capacitor 36 is mounted on both sides of the TIA 34 on the first face 20 and is electrically coupled to the PD element 32 and the TIA 34 via the bonding wire 38 and so on. For example, the capacitor 36 is electrically coupled to the PD element 32 via the wiring 31b and the bonding wire 38. The TIA 34 and the capacitor 36 are directly mounted on the first face 20 of the mount portion 14. An outputting substrate 50 is composed of dielectric material such as ceramics, has a wiring 46 on which an AC coupling capacitor 48 is provided, and is mounted on the first face 20. The wiring 46 is a microwave transmission line such as micro strip line. The TIA 34 is electrically coupled to the wiring 46 provided on the outputting substrate 50 via the bonding wire 38. In this way, electronic components such as the TIA 34 and the capacitor 36 that are electrically coupled to the PD element 32 are mounted on the first face 20 of the mount portion 14.

The wiring 46 is formed on the upper face of the outputting substrate 50 and is adjacent to a side face of the outputting lead 18a. The wiring 46 is connected to the side face of the outputting lead 18a by a solder. The wiring 46 provided on the outputting substrate 50 is coupled to the outputting lead 18a from a direction in parallel with an extending direction of the outputting lead 18a. Thus, the wiring 46 is electrically coupled to the outputting lead 18a. Therefore, a current signal converted from an optical signal by the PD element 32 is converted into a voltage signal and is amplified by the TIA 34. After that, the voltage signal is output from the outputting lead 18a via the wiring 46. In this way, the electronic components mounted on the first face of the mount portion 14 includes the TIA 34 and so on, and structure a signal processing circuit coupled to the PD element 32. When the optical device 100 is used for high frequency wave, the loss caused by discontinuity between the wiring 46 and the outputting lead 18a is restrained, and favorable high frequency wave characteristics are achieved, because the wiring 46 is coupled to the outputting lead 18a from the direction in parallel with the extending direction of the outputting lead 18a.

The capacitor 36, a resistor 40 and a thermistor 52 acting as a temperature detection element are mounted on the second face 22 of the mount portion 14. The capacitor 36 and the resistor 40 mounted on the second face 22 are electrically coupled to the capacitor 36 mounted on the first face 20 via a wiring 44 provided in a wiring piece 42 composed of dielectric material mounted on the recess of the mount portion 14 and the bonding wire 38. That is, electronic components such as the capacitor 36 and the resistor 40 electrically coupled to the PD element 32 are mounted on the second face 22 of the mount portion 14. The capacitor 36, the resistor 40, and the thermistor 52 are directly mounted on the second face 22 of the mount portion 14.

One of the capacitors 36 mounted on the second face 22 of the mount portion 14 is electrically coupled to the PD power-supply lead 18c via the bonding wire 38. Another capacitor 36 is electrically coupled to the TIA power-supply lead 18b via the bonding wire 38. Thus, electrical power provided from the PD power-supply lead 18c is provided to the PD element 32 via an electronic component mounted on the second face 22 and another electronic component mounted on the first face 20. Similarly, electrical power provided from the TIA power-supply lead 18b is provided to the TIA 34 via an electronic component mounted on the second face 22 and another electronic component mounted on the first face 20. In this way, the electronic component mounted on the second face 22 of the mount portion 14 structures a power supply circuit for supplying electrical power to the TIA 34 or the PD element 32 mounted on the first face 20.

The thermistor 52 mounted on the second face 22 of the mount portion 14 is positioned at an opposite side of the TIA 34 mounted on the first face 20. That is, the thermistor 52 is mounted on an area of the second face 22 facing with the TIA 34. The thermistor 52 is used for detecting a temperature of the TIA 34. The temperature detected by the thermistor 52 is output from the thermistor lead 18d electrically coupled to the thermistor 52 and the bonding wire 38.

Figure 6A:
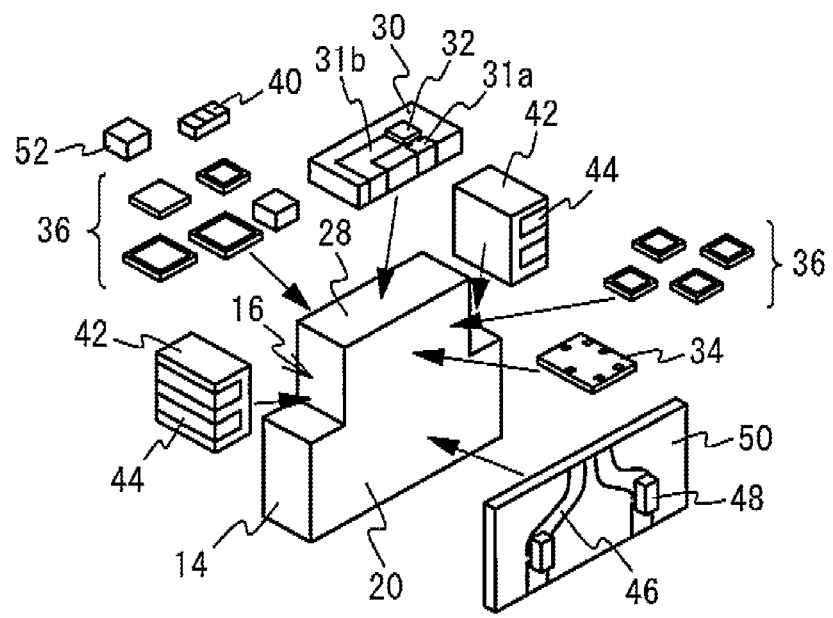
FIG. 6A and FIG. 6B illustrate a perspective view explaining a manufacturing method of the optical device in accordance with the first embodiment.

Next, a description will be given of a manufacturing method of the optical device in accordance with the first embodiment. FIG. 6A through FIG. 8B illustrate a perspective view explaining the manufacturing method of the optical device in accordance with the first embodiment. As illustrated in FIG. 6A, the mount portion 14 having a convex shape and having a recess 16 is prepared. The TIA 34, the capacitor 36, and the outputting substrate 50 having the wiring 46 and the AC coupling capacitor 48 are mounted on the first face 20 of the mount portion 14. The capacitor 36, the resistor 40 and the thermistor 52 are mounted on the second face 22 of the mount portion 14. The PD element 32 is mounted on the upper face 28 of the mount portion 14 through the element-mount portion 30 having the wiring 31a and the wiring 31b. Further, the wiring piece 42 composed of dielectric material having the wiring 44 for electrically coupling an electronic component mounted on the first face 20 and another electronic component mounted on the second face 22 is mounted on the recess 16 of the mount portion 14. In the first embodiment, the example where the outputting substrate 50 is mounted on the mount portion 14 is described in detail. However, the outputting substrate 50 may be mounted on the mount portion 14 in advance. In this case, the manufacturing method of the optical device in accordance with the first embodiment can be simplified.

Figure 6B:
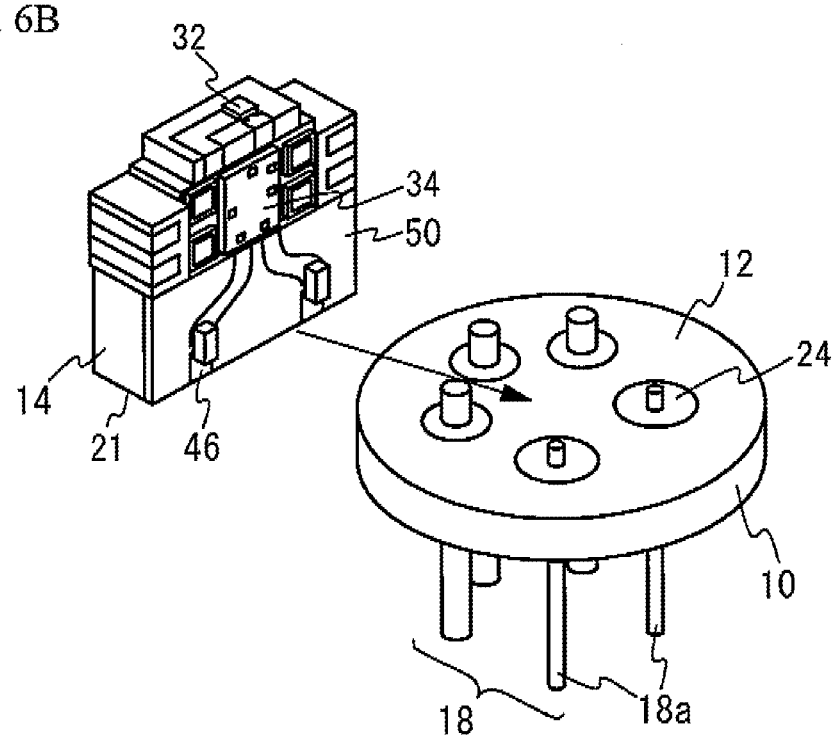

As illustrated in FIG. 6B, a plurality of the leads 18 penetrating the stem 10 are fixed to the stem 10 with the insulator 24. The lead 26 (not illustrated) is coupled to a center area of the lower face of the stem 10 with brazing filler metal. A lower face 21 of the mount portion 14 on which the PD element 32 and the TIA 34 are mounted is coupled to the upper face 12 of the stem 10 so that the mount portion 14 is sandwiched by the plurality of the leads 18. In this case, the mount portion 14 is mounted on the upper face 12 of the stem 10 so that the wiring 46 on the outputting substrate 50 mounted on the mount portion 14. Thus, the wiring 46 on the outputting substrate 50 is electrically coupled to the outputting leads 18a.

Figure 7A:
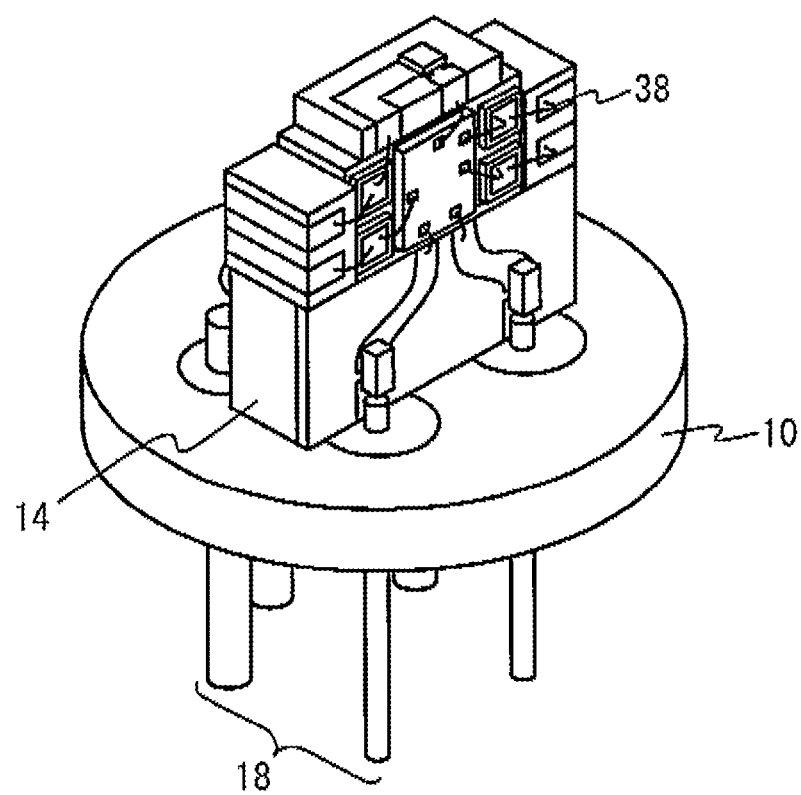
FIG. 7A and FIG. 7B illustrate a perspective view explaining a manufacturing method of the optical device in accordance with the first embodiment.

As illustrated in FIG. 7A, an electronic component mounted on the first face 20, another electronic component mounted on the second face 22, and the PD element 32 mounted on the upper face 28 are coupled by the bonding wire 38. Thus, the electronic component mounted on the first face 20, the electronic component mounted on the second face 22, and the PD element 32 mounted on the upper face 28 are electrically coupled to each other. Electronic components mounted on the second face 22 of the mount portion 14 are coupled to the PD power-supply lead 18c, the TIA power-supply lead 18b, and the thermistor lead 18d by the bonding wire 38. Thus, the electronic components mounted on the second face 22 of the mount portion 14 are electrically coupled to the PD power-supply lead 18c, the TIA power-supply lead 18b, and the thermistor lead 18d.

Figure 7B:
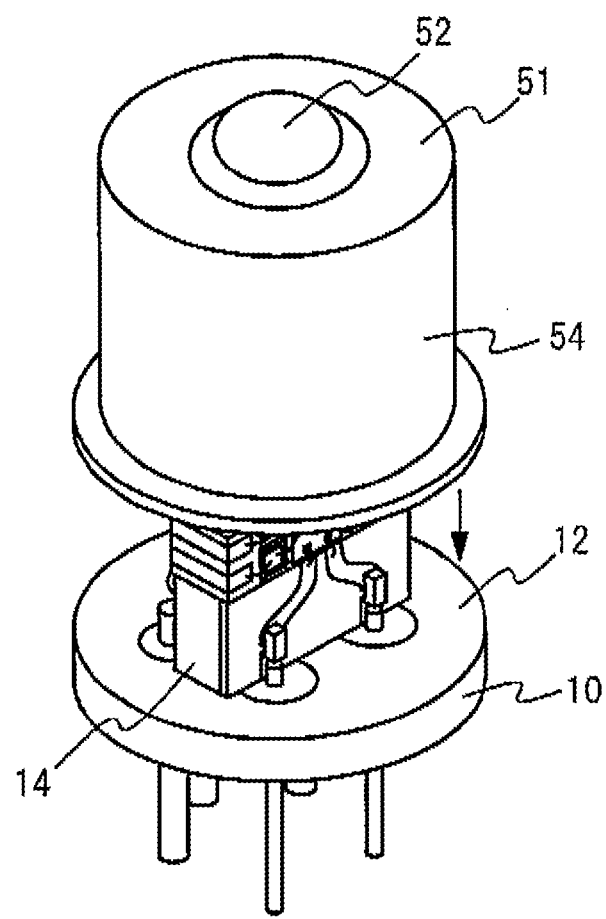

As illustrated in FIG. 7B, a cap 54 having a circular-piped shape and having an opening in an upper face 51 of the cap 54. The optical axis with respect to the PD element 32 is passing through the opening. In this embodiment, a lens 53 is fixed in the opening. A window plate may be fixed to the opening instead of the lens 53. The cap 54 is fixed to the upper face 12 of the stem 10 by welding. The cap 54 is welded to the stem 10. The cap 54 is, for example, composed of a metal such as the kovar. Thus, the PD element 32 mounted on the mount portion 14 is sealed by the cap 54.

Figure 8A:
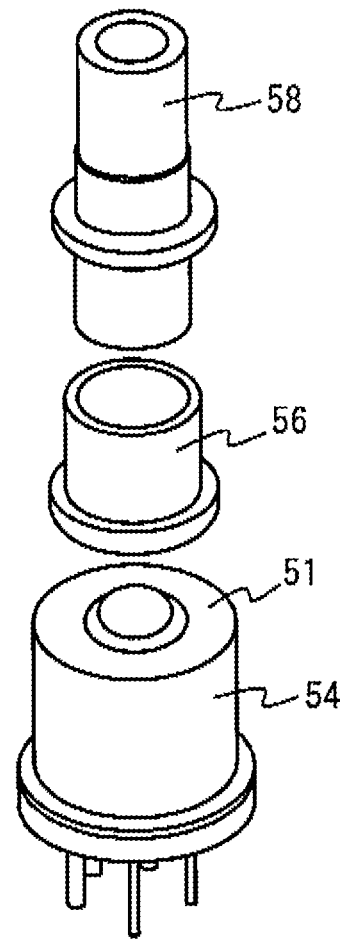
FIG. 8A and FIG. 8B illustrate a perspective view explaining a manufacturing method of the optical device in accordance with the first embodiment.
Figure 8B:
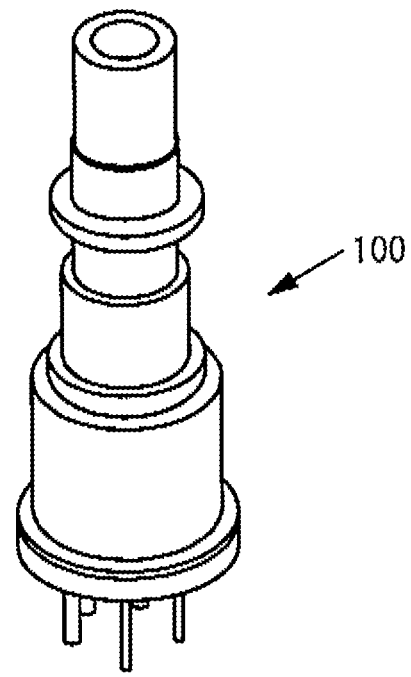

As illustrated in FIG. 8A, a guide 56 composed of a metal and a receptacle 58 composed of a metal are fixed to the upper face 51 of the cap 54 by YAG welding or with resin so that an optical fiber in the receptacle 58 is aligned to the PD element 32. Thus, the optical device 100 in accordance with the first embodiment illustrated in FIG. 8B is fabricated.

As mentioned above, in accordance with the first embodiment, as illustrated in FIG. 3 and FIG. 4, the optical device 100 has the mount portion 14 projecting from the upper face 12 of the stem 10. The mount portion 14 has the upper face 28, the lower face, the first face 20 and the second face that act as a side face with respect to the upper face 28 and the lower face. The lower face of the mount portion 14 is coupled to the upper face 12 of the stem 10. The PD element 32 is mounted on the upper face 28. The electronic components such as the TIA 34 and the capacitor 36 electrically coupled to the PD element 32 are mounted on the first face 20 and the opposite second face 22. And, the plurality of the leads 18 penetrating the stem 10 sandwich the mount portion 14, are extracted from the first face 20 side and the second face 22 side, and are electrically coupled to the electronic components mounted on the first face 20 and the second face 22.

When electronic components are mounted on the first face 20 and the second face 22 of the mount portion 14 projecting from the upper face 12 of the stem 10, a large space for mounting is secured, and integration degree of components is improved. There may be a case where a space for mounting may be insufficient in an optical device operating in a broad frequency band. This is because the number of the electronic components is increased, because a filter used in a broadband from low frequency to high frequency is structured with a plurality of electronic components. However, in accordance with the first embodiment, the space for mounting may be secured. When the leads 18 are extracted from the first face 20 side and the second face 22 side sandwiching the mount portion 14, an electronic component mounted on the first face 20 is electrically coupled to the lead 18 positioned on the first face 20 side, and another electronic component mounted on the second face 22 is electrically coupled to the lead 18 positioned on the second face 22 side. Thus, the bonding wire 38 for coupling the electronic component and the lead 18 is provided on the first face 20 and the second face 22 of the mount portion 14. This allows a simple coupling between the electronic components and the leads 18 compared to a case where all bonding wires are provided on only one of the first face 20 and the second face 22. Thus, a freedom degree of arrangement of electronic components and the leads 18 is increased. Therefore, in accordance with the first embodiment, it is possible to secure a large space for mounting. And it is possible to arrange and couple the electronic components and the leads 18 easily.

As illustrated in FIG. 3 and FIG. 4, the PD element 32 is mounted on the upper face 28 that is one of the faces of the mount portion 14 and is different from the first face and the second face 22 on which an electronic component such as the TIA 34 and the capacitor 36 is mounted. It is therefore secure a mount space for an electronic component such as the capacitor 36 mounted on the first face 20 and the second face 22.

It is preferable that: the stem 10 and the mount portion 14 are composed of a metal; and the lead 26 electrically coupled to the stem 10 and the mount portion 14 is coupled to the lower face 13 of the stem 10 as illustrated in FIG. 5. This allows preferable radiation performance of heat generated in an electronic component such as the TIA 34 mounted on the mount portion 14. And, the optical device 100 in accordance with the first embodiment has preferable high frequency wave performance. For example, a mount portion composed of dielectric material and having a through hole coupling a ground wiring formed on a main face and another ground wiring formed on a reverse face has a large resistance and a large inductance of a ground wiring in the through hole. Therefore, it is difficult to obtain a stable reference level (ground level) with respect to high frequency wave. However, in accordance with the first embodiment, it is possible to obtain a stable reference level (ground level) with respect to high frequency wave on a whole area of the mount portion, because the mount portion is composed of a metal. Thus, the optical device 100 has preferable high frequency wave performance because the mount portion is composed of a metal.

The stem 10 coupled to the lead 26 may be composed of a metal, and the mount portion 14 may be composed of dielectric material. In this case, it is preferable that a wiring electrically coupled to the stem 10 is provided on the mount portion 14, and an electronic component mounted on the mount portion 14 is electrically coupled to the wiring.

As illustrated in FIG. 3 and FIG. 4, it is preferable that: the wiring piece 42 is composed of dielectric material such as ceramics; the wiring 44 is provided on a surface of the wiring piece 42; and an electronic component mounted on the first face 20 and another electronic component mounted on the second face 22 are electrically coupled to each other via the wiring 44. In this case, an electronic component mounted on the first face 20 is electrically coupled to another electronic component mounted on the second face 22 easily.

As illustrated in FIG. 6A, it is preferable that the wiring piece 42 is mounted in the recess 16 formed in the mount portion 14. In this case, the wiring piece 42 may be mounted on the mount portion 14 stably and easily. Further, the optical device 100 may be downsized. The position of the recess 16 is not limited to the upper face 28 of the mount portion 14. The recess 16 may be formed in another area such as the lower face 21 side of the mount portion 14. The mount portion 14 may have a rectangular parallelepiped shape without the recess 16, and the wiring piece 42 may be mounted on the upper face 28 of the mount portion 14. That is, it is preferable that the wiring piece 42 is mounted on the mount portion 14 except for the first face 20 and the second face 22. The wiring piece 42 may be mounted on the upper face 12 of the stem 10.

A temperature of an integrated circuit such as a TIA or an optical element such as a PD element is detected, and an operation condition or operation temperature range is controlled. In this case, a temperature detection element such as a thermistor is generally used for detecting a temperature. It is preferable that the thermistor is arranged near an object (for example, a TIA) in order to detect a temperature accurately. However, an optical device operating in a broad frequency band has many electronic components. The electronic components are arranged near a TIA in order to achieve high frequency characteristics. Therefore, a thermistor cannot be arranged near the TIA. And, it is difficult to measure the temperature of the TIA accurately.

Figure 9:
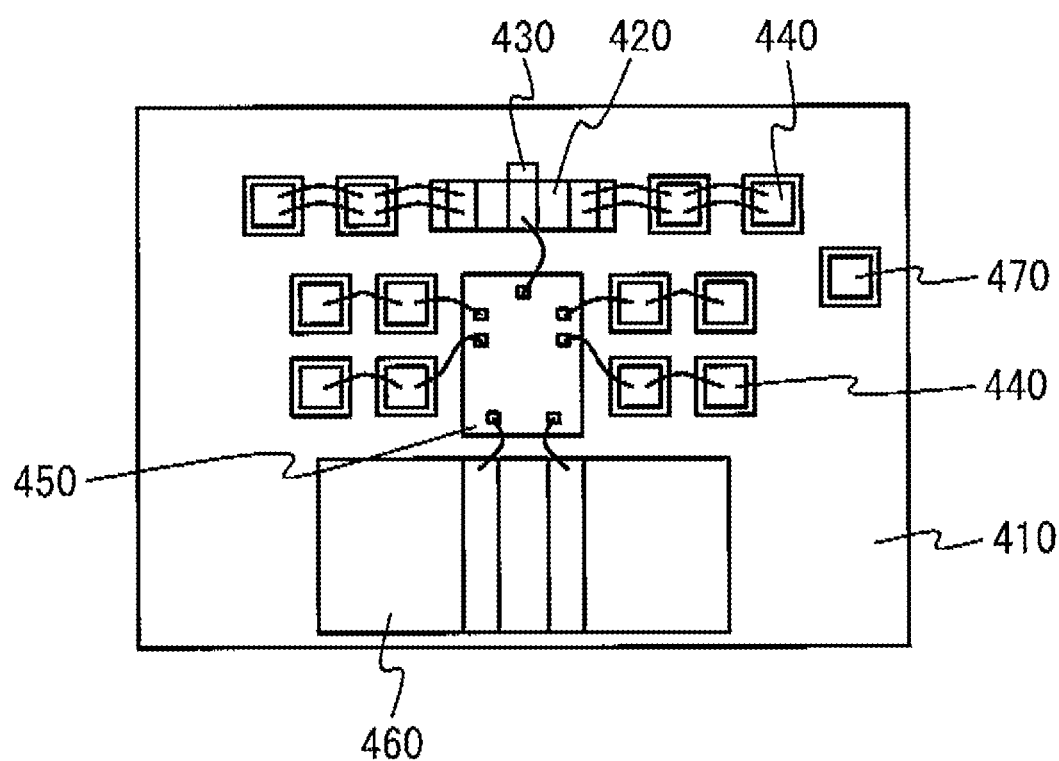
FIG. 9 illustrates a top view of a mount portion of an optical device in accordance with a third comparative example.

Here, a description will be given of an arrangement of an electronic component and a thermistor of an optical device having many electronic components in accordance with a third comparative example. FIG. 9 illustrates a top view of a mount portion of an optical device in accordance with the third comparative example. As illustrated in FIG. 9, a PD element 430 is mounted on an element-mount portion 420. The element-mount portion 420 is mounted on a mount portion 410. An electronic component 440 such as a capacitor electrically coupled to the PD element 430 is arranged near the PD element 430. The electronic component 440 such as a capacitor electrically coupled to a TIA 450 mounted on the mount portion 410 and an outputting substrate 460 are arranged near the TIA 450. Therefore, a thermistor 470 for measuring the temperature of the TIA 450 must be arranged away from the TIA 450. And it is difficult to measure the temperature of the TIA 450 accurately.

However, in the first embodiment, as illustrated in FIG. 3 and FIG. 4, an integrated circuit acting as the TIA 34 is mounted on the first face 20 of the mount portion 14, and a temperature detection element acting as the thermistor 52 is mounted on an area of the second face 22 of the mount portion 14 facing with the TIA 34. Thus, the thermistor 52 may be arranged closer to the TIA 34 than the third comparative example. It is therefore possible to measure the temperature of the TIA 34.

Figure 10A:
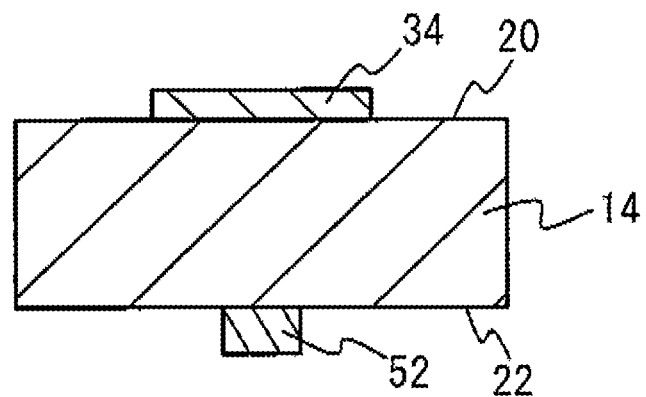
FIG. 10A through FIG. 10C illustrate a cross section for explaining a position of a thermistor.
Figure 10B:
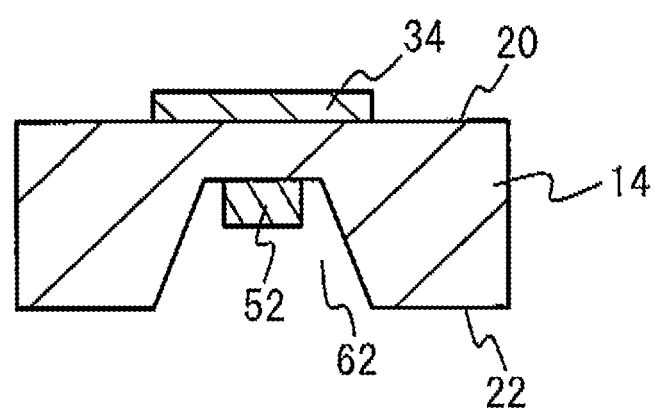
Figure 10C:
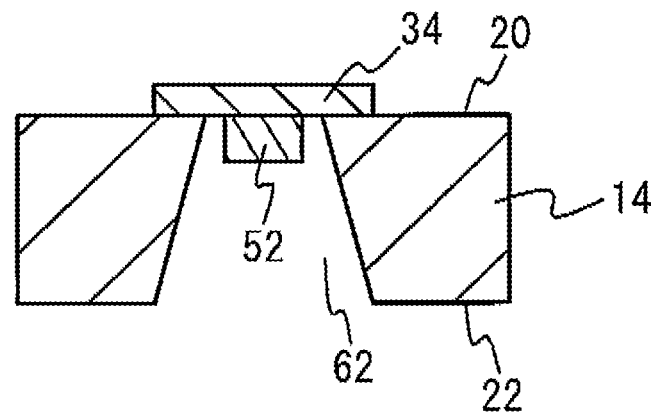

In the first embodiment, as illustrated in FIG. 10A, the thermistor 52 is mounted on an area of the second face 22 facing with the TIA 34 mounted on the first face 20. However, the structure is not limited. For example, as illustrated in FIG. 10B, a recess portion 62 may be formed in an area of the second face 22 facing with the TIA 34, and the thermistor 52 may be provided in the recess portion 62. As illustrated in FIG. 10C, the recess portion 62 may penetrate from the second face 22 to the first face 20, and the thermistor 52 may be directly mounted on the reverse face of the TIA 34. That is, the thermistor 52 may be mounted in the recess portion 62 formed in the second face 22 facing with the TIA 34, In the examples of FIG. 10B and FIG. 10C, the thermistor 52 is arranged closer to the TIA 34 than the example of FIG. 10A. It is therefore possible to measure the temperature of the TIA 34 more accurately.

In the first embodiment, an electronic component mounted on the second face 22 is electrically coupled to the lead 18 via the bonding wire 38. However, the electronic component and the lead 18 may be electrically coupled with another method. In the first embodiment, the mount portion 14 is mounted on the upper face 12 of the stem 10 after the stem 10 and the mount portion 14 are casted separately. However, the stem 10 may be casted together with the mount portion 14.

In the first embodiment, a CAN package type light receiver having the PD element 32 is described. However, the same structure may be applied to a CAN package type light transmitter having an LD element.

Second Embodiment

Figure 11:
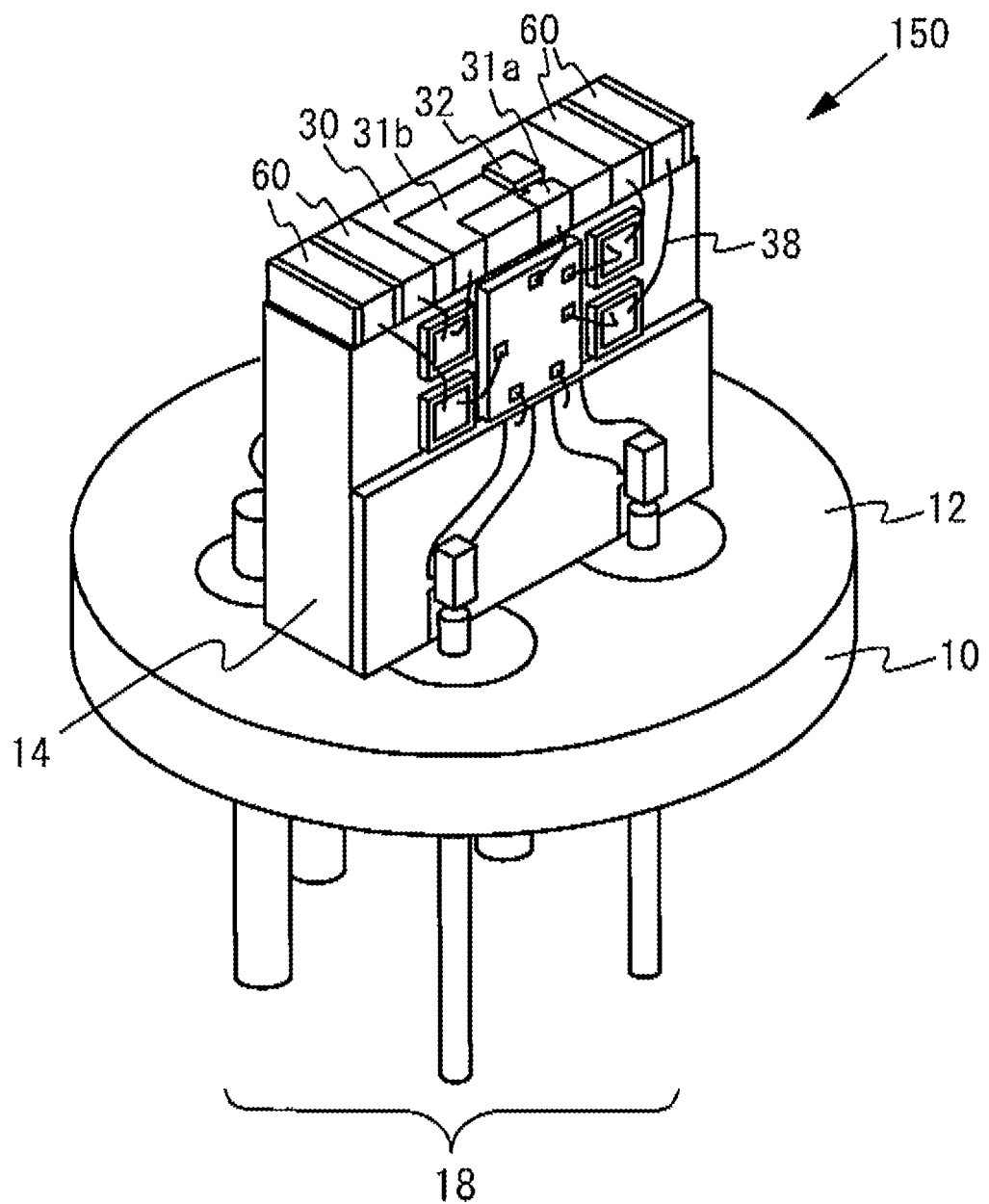
FIG. 11 illustrates a perspective view of an optical device in accordance with a second embodiment.

FIG. 11 illustrates a perspective view of an optical device in accordance with a second embodiment. As illustrated in FIG. 11, in an optical device 150 in accordance with the second embodiment, the mount portion 14 has a rectangular parallelepiped shape, and the wiring piece 42 is not mounted. A wiring 60 is provided on the element-mount portion 30 on which the PD element 32 is mounted. An electronic element mounted on the first face 20 is electrically coupled to another electronic component mounted on the second face 22 via the wiring 60 and the bonding wire 38. The other structure is the same as the first embodiment. The other structure is illustrated in FIG. 3 and FIG. 4. Therefore, an explanation of the other structure is omitted.

In the second embodiment, the element-mount portion composed of dielectric material on which the PD element 32 is mounted has the wiring 60 electrically coupling an electronic component mounted on the first face 20 and another electronic component mounted on the second face 22. Therefore, it is not necessary to provide the wiring piece 42. And, the number of components is reduced, and the optical device 150 is downsized.

In the second embodiment, the wiring piece 42 of the first embodiment may be mounted. With the structure, an electronic component mounted on the first face 20 and another electronic component mounted on the second face 22 can be electrically coupled to each other by the wiring 60 mounted on the element-mount portion 30 of the second embodiment and the wiring 44 mounted on the wiring piece 42 of the first embodiment.

The present invention is not limited to the specifically disclosed embodiments and variations but may include other embodiments and variations without departing from the scope of the present invention.

What is claimed is:

1. An optical device comprising:
a stem;
a mount portion connected with the stem and having an upper face, a first face and a second face opposite to the first face, the first face and the second face constituting a side face with respect to the upper face;
an optical element mounted on the upper face of the mount portion;
electronic components mounted on the first face and the second face of the mount portion respectively;
a first lead that penetrates the stem and is extended to a side of the first face of the mount portion; and
a second lead that penetrates the stem and is extended to a side of the second face of the mount portion.

2. The optical device as claimed in claim 1 further comprising a wiring piece that has a wiring electrically coupling the electronic components mounted on the first face and the second face, is provided on the mount portion, and is composed of dielectric material,
wherein the stem and the mount portion are composed of a metal.

3. The optical device as claimed in claim 2 further comprising a third lead electrically coupled to the stem and the mount portion.

4. The optical device as claimed in claim 2, wherein:
the mount portion has a recess; and
the wiring piece is mounted on the recess.

5. The optical device as claimed in claim 1 further comprising a wiring piece composed of a dielectric material,
wherein:
the wiring piece has a wiring electrically coupled between the electronic components mounted on the first face and the second face; and
the stem and the mount portion are composed of a metal.

6. The optical device as claimed in claim 1, wherein:
the electronic component mounted on the first face has an integrated circuit; and
a temperature detection element is mounted on an area of the second face facing with the integrated circuit.

7. The optical device as claimed in claim 6, further comprising a recess formed in the second face of the mount portion,
wherein the temperature detection element is mounted in the recess.

8. The optical device as claimed in claim 1, wherein:
the electronic component mounted on the first face has a signal processing circuit coupled to the optical element; and
the electronic component mounted on the second face has a power-supply circuit for supplying electrical power to the signal processing circuit or the optical element.

9. The optical device as claimed in claim 1 further comprising a substrate composed of a dielectric material,
wherein:
the stem and the mount portion are composed of a metal; and
the substrate is mounted on the first face of the mount portion and has a wiring formed on an upper face of the substrate.

10. The optical device as claimed in claim 9, wherein the wiring formed on the upper face of the substrate is adjacent to a side face of the first lead.

11. The optical device as claimed in claim 1, further comprising a cap that encapsulates the mount portion and has an opening formed in the cap.

12. An optical device comprising:
a stem composed of a metal;
a mount portion composed of a metal and connected with the stem, the mount portion having an upper face, a first face and a second face opposite to the first face, the first face and the second face constituting a side face with respect to the upper face, the mount portion being electrically coupled with the stem;
an optical element mounted on the upper face of the mount portion;
electronic components mounted on the first face and the second face of the mount portion respectively;
a first lead that penetrates the stem and is extended to a side of the first face of the mount portion;
a second lead that penetrates the stem and is extended to a side of the second face of the mount portion;
a third lead extended from the stem to outside and electrically coupled to the stem;
a wiring piece composed of a dielectric material, the wiring piece having a wiring electrically coupled between the electronic components mounted on the first face and the second face; and
a substrate composed of a dielectric material, the substrate being mounted on the first face of the mount portion and having a wiring formed on an upper face of the substrate adjacent to a side face of the first lead.

13. The optical device as claimed in claim 1, wherein the optical element is a Photo Diode.

14. The optical device as claimed in claim 8, wherein the signal processing circuit is Trans Impedance Amplifier.

15. The optical device as claimed in claim 1, wherein the third lead is located in the center of the stem.

16. The optical device as claimed in claim 11, further comprising a receptacle connected with the cap.

17. The optical device as claimed in claim 9, wherein the wiring formed on the upper face of substrate is a microwave transmission line.

18. The optical device as claimed in claim 1, wherein the second lead supplies electrical power to the electric components or the optical element.

* * * * *